(12) United States Patent
Sakata et al.

(10) Patent No.: US 7,183,835 B2
(45) Date of Patent: Feb. 27, 2007

(54) SEMICONDUCTOR DEVICE WHICH REALIZES A SHORT-CIRCUIT PROTECTION FUNCTION WITHOUT SHUNT RESISTOR, AND SEMICONDUCTOR DEVICE MODULE

(75) Inventors: Hiroshi Sakata, Tokyo (JP); Tomofumi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 126 days.

(21) Appl. No.: 11/023,590

(22) Filed: Dec. 29, 2004

(65) Prior Publication Data
US 2005/0146823 A1 Jul. 7, 2005

(30) Foreign Application Priority Data
Jan. 6, 2004 (JP) ............................. 2004-001057
Sep. 9, 2004 (JP) ............................. 2004-262033

(51) Int. Cl.
*H03K 17/0812* (2006.01)
(52) U.S. Cl. ..................... 327/434; 327/436; 327/77; 361/93.7
(58) Field of Classification Search ............... None
See application file for complete search history.

(56) References Cited

U.S. PATENT DOCUMENTS 5,365,397 A * 11/1994 Kadota ................. 361/94
5,467,242 A * 11/1995 Kiraly .................. 361/94
6,906,574 B2 * 6/2005 Ohi et al. .............. 327/392
2004/0252432 A1 * 12/2004 Sasaki et al. .......... 361/91.1

FOREIGN PATENT DOCUMENTS

| DE | 103 34 832 A1 | 3/2004 |
|---|---|---|
| EP | 0 487 964 A2 | 11/1991 |
| JP | 2000-101408 A | 4/2000 |
| JP | 2002-247857 A | 8/2002 |
| JP | 2002-315303 A | 10/2002 |
| WO | WO 98/59421 | 12/1998 |

\* cited by examiner

*Primary Examiner*—Timothy P. Callahan
*Assistant Examiner*—Terry L. Englund
(74) *Attorney, Agent, or Firm*—McDermott Will & Emery LLP

(57) ABSTRACT

A control output signal is supplied to a gate electrode of an insulated gate transistor from a control signal output terminal of a control device, however, with regard to the insulated gate transistor, a control output signal is also influenced when that transistor is short-circuited, and a signal waveform different from that in a normal operating state occurs. The short-circuit is detected by monitoring the control output signal of the insulated gate transistor, and in case of the short-circuit, the short-circuit protection of the insulated gate transistor is performed by forcing the control device to stop that control output signal.

8 Claims, 7 Drawing Sheets

SEMICONDUCTOR DEVICE WHICH REALIZES A SHORT-CIRCUIT PROTECTION FUNCTION WITHOUT SHUNT RESISTOR, AND SEMICONDUCTOR DEVICE MODULE

BACKGROUND OF THE INVENTION

1. Field of the Invention

The present invention relates to a semiconductor device and a semiconductor device module, and more particularly, it relates to a semiconductor device and a semiconductor device module including a short-circuit protection function of an insulated gate type switching device such as an IGBT (Insulated Gate Bipolar Transistor) and so on.

2. Description of the Background Art

A semiconductor device in which the insulated gate type switching device such as the IGBT and so on and a control circuit controlling a drive of that switching device are packaged is called as an IPM (Intelligent Power Module), and with regard to a conventional IPM, a short-circuit protection is performed by connecting a shunt resistor detecting a main current flowing between main power terminals of the switching device outside the package and monitoring the main current.

For example, in FIG. 1 of Japanese Patent Application Laid-Open No. 2002-247857, a composition that a shunt resistor detecting a DC current flowing between main power terminals is connected outside a package is disclosed, and a current detecting terminal to detect a voltage put on the shunt resistor is set in the package.

As described above, with regard to the conventional IPM, the short-circuit protection is performed by detecting the main current of the switching device by the shunt resistor set outside the package, thus the current detecting terminal is necessary to detect the voltage put on the shunt resistor.

Moreover, it is necessary to set a filter circuit such as a CR filter and so on outside the package to remove a noise entering the shunt resistor and the current detecting terminal, and there is a possibility that a device becomes massive.

Moreover, when a length of a wiring from a ground main electrode to a ground terminal of the switching device becomes long by setting the shunt resistor, a voltage surge according to a switching of the switching device becomes large, and there is also a possibility that an error occurs.

SUMMARY OF THE INVENTION

A semiconductor device which realizes a short-circuit protection function without a shunt resistor and an IPM in which the semiconductor device is built are provided.

An aspect of a semiconductor device according to the present invention is that a semiconductor device controls a drive of an insulated gate transistor by generating a control output signal on a basis of a control input signal, and includes a driver outputting the control output signal and a short-circuit protection circuit detecting the control output signal and controlling and forcing the driver to stop the control output signal when a detecting voltage of the control output signal exceeds a predetermined reference voltage before a predetermined period passes after the control output signal indicates a conduction of the insulated gate transistor.

According to the semiconductor device described above, the short-circuit protection circuit detecting the control output signal of the insulated gate transistor and controlling and forcing the driver to stop the control output signal when a detecting voltage of the control output signal exceeds a predetermined reference voltage before a predetermined period passes after the control output signal indicates a conduction of the insulated gate transistor is included, thus a composition for the short-circuit protection can be simplified.

These and other objects, features, aspects and advantages of the present invention will become more apparent from the following detailed description of the present invention when taken in conjunction with the accompanying drawings.

DESCRIPTION OF THE PREFERRED EMBODIMENTS

<Composition Example of an IPM Applying the Present Invention>

Figure 1:
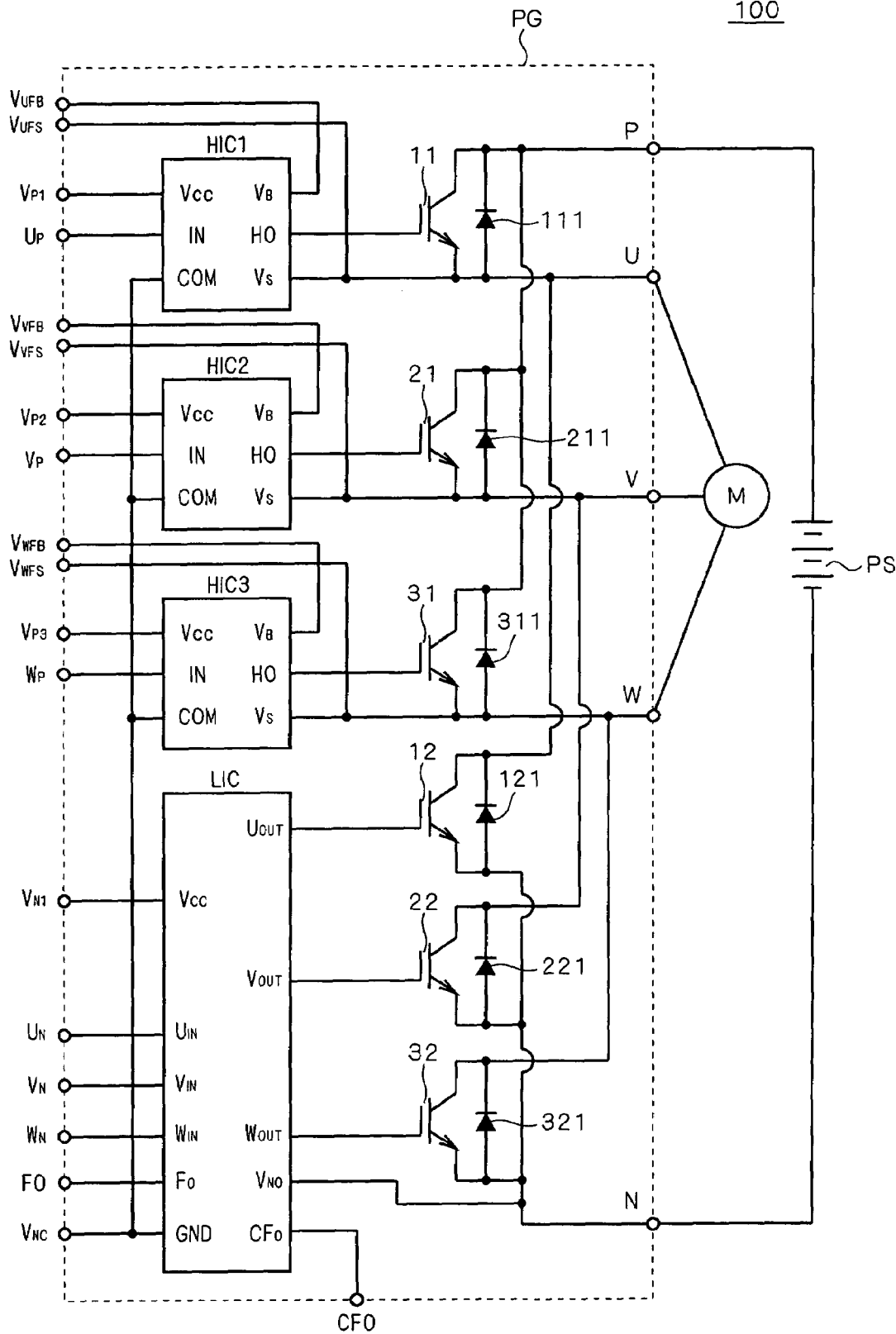
FIG. 1 is a drawing illustrating a composition of an inverter module according to the present invention.

An internal composition of an inverter module 100 is described as an example of the IPM (Intelligent Power-Module) applying the present invention in FIG. 1. Besides, the inverter module 100 has a DIP (Dual-In-line Package) structure that terminal rows are set in a row on two longitudinal side surfaces of a package PG, respectively.

As shown in FIG. 1, groups of transistors 11 and 12, 21 and 22 and 31 and 32 (all N channel type) which are insulated gate type switching devices such as an IGBT (Insulated Gate Bipolar Transistor) and so on are connected in a totem pole like between P-N terminals (between a high potential main power terminal P and a low potential main power terminal N) which are connected with a power source PS and becomes a main power terminal, and connection nodes are connected with output terminals U, V and W of a U phase, a V phase and a W phase of the package PG, respectively. Besides, the respective phases of a three-phase motor M are connected with the output terminals U, V and W, for example.

Moreover, free-wheeling diodes 111, 121, 211, 221, 311 and 321 are in inverse-parallel connection with the transistors 11, 12, 21, 22, 31 and 32, respectively.

Moreover, control devices HIC1, HIC2 and HIC3 are provided to control the transistors 11, 21 and 31 which are high potential devices, respectively. Besides, the control devices HIC1 to HIC3 are a so-called HVIC (High Voltage Integrated Circuit) and are functionally identical with each other, thus identical terminal codes are put on them.

The inverter module 100 has a composition that a control output signal is supplied to respective gate electrodes of the transistors 11, 21 and 31 from respective control signal output terminals HO of the control devices HIC1, HIC2 and HIC3.

Moreover, respective reference potential terminals $V_S$ of the control devices HIC1 to HIC3 are connected with not only the output terminals U, V and W but also reference potential terminals $V_{UFS}$, $V_{VFS}$ and $V_{WFS}$ of the package PG. Moreover, respective drive voltage terminals $V_B$ of the control devices HIC1 to HIC3 are connected with drive voltage terminals $V_{UFB}$, $V_{VFB}$ and $V_{WFB}$ of the package PG. Besides, the drive voltage terminal $V_B$ is a terminal providing a drive voltage VB of high potential side to the respective HVIC, and the reference potential terminal $V_S$ is a terminal providing a reference potential VS of high potential side to the respective HVIC.

Moreover, the control devices HIC1 to HIC3 have a drive voltage terminals $V_{CC}$, a ground terminal COM and a control signal input terminal IN, respectively.

Then, the respective drive voltage terminals $V_{CC}$ of the control devices HIC1 to HIC3 are connected with drive voltage terminals $V_{P1}$, $V_{P2}$ and $V_{P3}$ of the package PG, and the respective ground terminals COM are connected with a ground terminal $V_{NC}$ of the package PG in common.

Moreover, the respective control signal input terminals IN of the control devices HIC1 to HIC3 are connected with control signal input terminals $U_P$, $V_P$ and $W_P$ of the package PG.

Moreover, a control device LIC is provided in the inverter module 100 to control the transistors 12, 22 and 32 which are low potential devices. Besides, the control device LIC is a so-called LVIC (Low Voltage Integrated Circuit).

The inverter module 100 has a composition that a control output signal is supplied to respective gate electrodes of the transistors 12, 22 and 32 from control signal output terminals $U_{OUT}$, $V_{OUT}$ and $W_{OUT}$ of the control device LIC, respectively.

Moreover, a reference potential terminal $V_{NO}$ of the control device LIC is connected with the main power terminal N of low potential side of the package PG. Besides, the reference potential terminal $V_{NO}$ is a terminal providing a reference potential (ground potential) of low potential side to the control device LIC.

Moreover, the control device LIC has control signal input terminals $U_{IN}$, $V_{IN}$ and $W_{IN}$ to which a control output signal to control the respective transistors 12, 22 and 32 is supplied and has a drive voltage terminal $V_{CC}$, a fault terminal $F_O$, an error output time setting terminal $CF_O$ setting a time since an abnormal state such as a short-circuit and so on occurs until a protection performance is cancelled and also has a ground terminal GND.

Moreover, the drive voltage terminal Vcc, the fault terminal $F_O$, the error output time setting terminal $CF_O$ and the ground terminal GND of the control device LIC are connected with a drive voltage terminal $V_{N1}$, a fault terminal FO, error output time setting terminal CFO and the ground terminal $V_{NC}$ of the package PG, respectively.

Moreover, the control signal input terminals $U_{IN}$, $V_{IN}$ and $W_{IN}$ of the control device LIC are connected with control signal input terminals $U_N$, $V_N$ and $W_N$ of the package PG, respectively.

The inverter module 100 described above has a composition that a shunt resistor and a current detecting terminal connecting the shunt resistor which are conventionally necessary are not included but the LVIC or the HVIC in the module includes the short-circuit protection function.

A case that the LVIC and the HVIC include the short-circuit protection function is described hereinafter in preferred embodiments 1 and 2, respectively.

<A. Preferred Embodiment 1>
<A-1. Composition of the Device>

Figure 2:
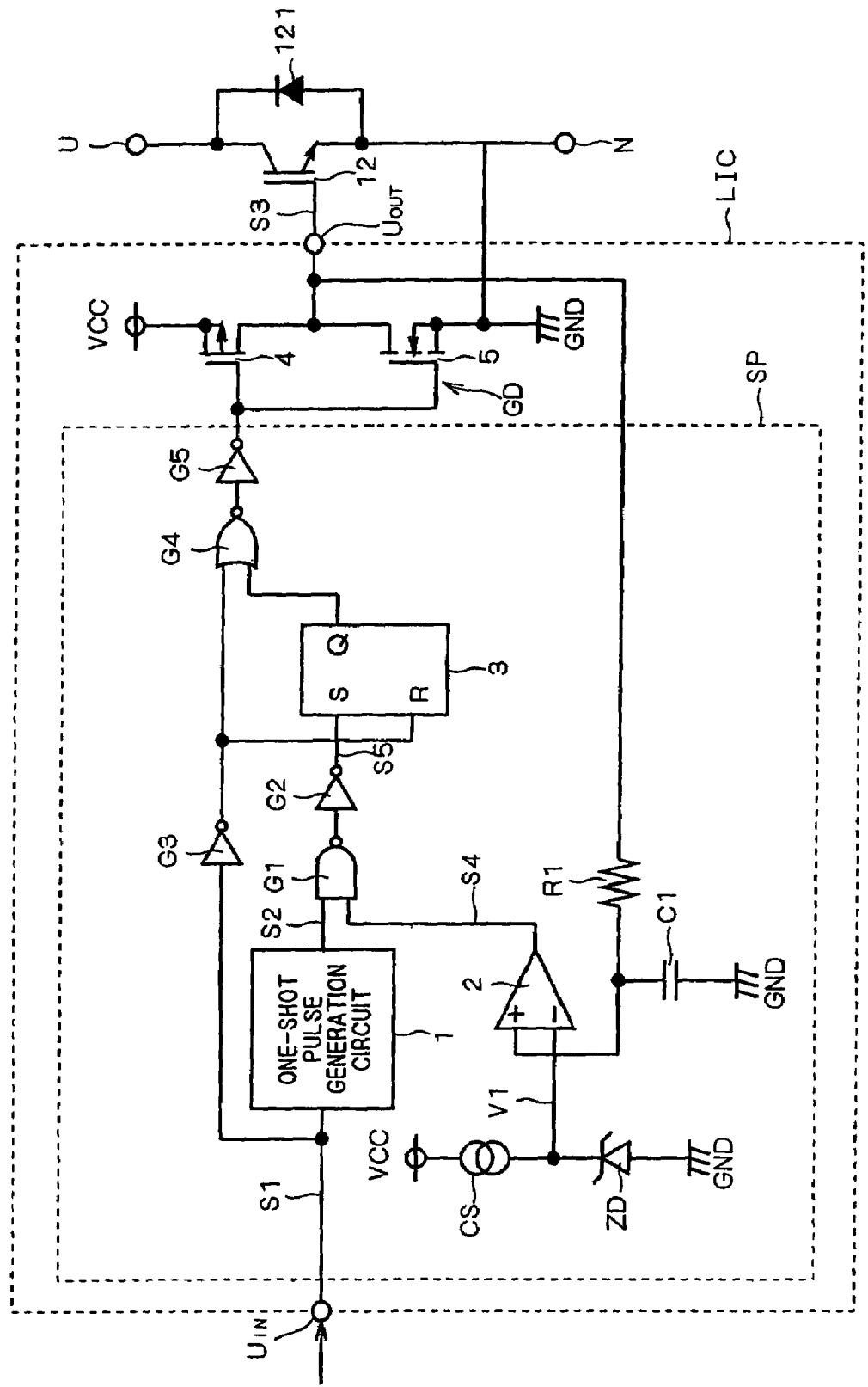
FIG. 2 is a drawing illustrating a composition of a control device in a preferred embodiment 1 according to the present invention.

A composition of the control device LIC including the short-circuit protection function is illustrated in FIG. 2 as the preferred embodiment 1 according to the present invention. Besides, in FIG. 2, the composition is described by applying a circuit performing a switching control of the transistor 12 as an example in the control device LIC.

As shown in FIG. 2, the control output signal is supplied to the gate electrode of the transistor 12 from the control signal output terminal $U_{OUT}$ of the control device LIC, however, with regard to the insulated gate transistor, the control output signal is also influenced when that transistor is short-circuited, and a signal waveform different from that in a normal operating state occurs. The present invention is focused on this phenomenon, and it detects the short-circuit by monitoring the control output signal of the insulated gate transistor, and in case of the short-circuit, the short-circuit protection of the insulated gate transistor is performed by forcing the control device LIC to stop the control output signal.

In particular, the control output signal of the insulated gate transistor, that is to say, an output signal of a gate driver GD composed of a P channel MOS transistor 4 and a N channel MOS transistor 5 connected in series between a drive voltage VCC and the ground potential GND is supplied as a control output signal S3 to the gate electrode of the transistor 12, and it is inputted to a + (plus) side input terminal of a comparator 2 as a detecting voltage of the control output signal S3, too, and in the comparator 2, a comparison with a reference voltage V1 supplied to a − (minus) side input terminal is performed, and its comparison result is outputted as a comparison result signal S4. Besides, a resistance R1 inserted in a + side input line of the comparator 2 and a capacitor C1 inserted between that + side input line and the ground potential GND constitute a noise filter.

Here, as a composition to supply the reference voltage V1, an easy composition employing a constant current source CS and a zener diode ZD can be applied as shown in FIG. 2, for example, the reference voltage V1 can be obtained by clamping the drive voltage VCC to a desired voltage with employing a zener voltage characteristic of the zener diode ZD.

In the meantime, a control input signal S1 supplied to control the transistor 12 from the outside through the control signal input terminal $U_{IN}$ is supplied not only to the gate driver GD via an inverter circuit G3, a NOR circuit G4 and an inverter circuit G5 but also to an one-shot generation circuit 1.

The one-shot pulse generation circuit 1 is a circuit which rises according to a timing of a rising of the control input signal S1 and outputs singly a pulse signal S2 maintaining a high potential ("H") state for a certain period which is predetermined.

Figure 3:
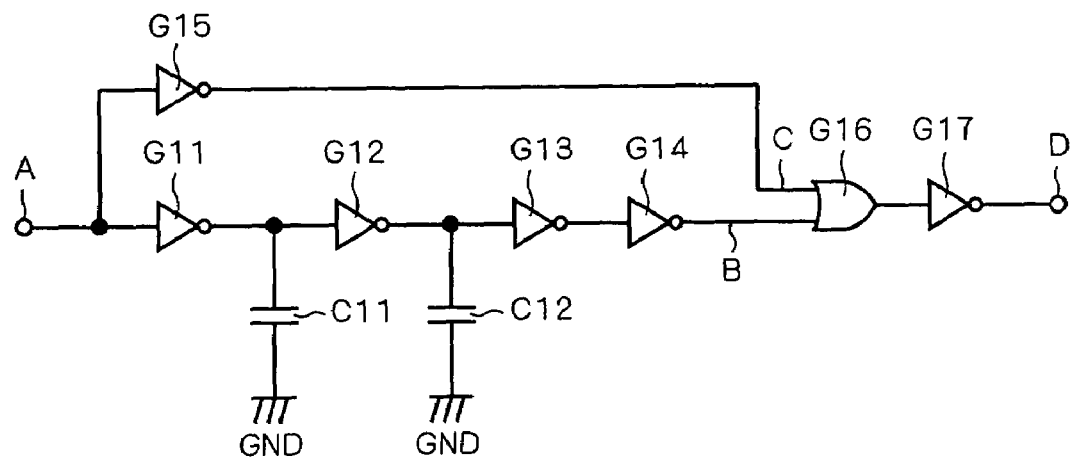
FIG. 3 is a drawing illustrating a composition of a one-shot pulse generation circuit.
Figure 4:
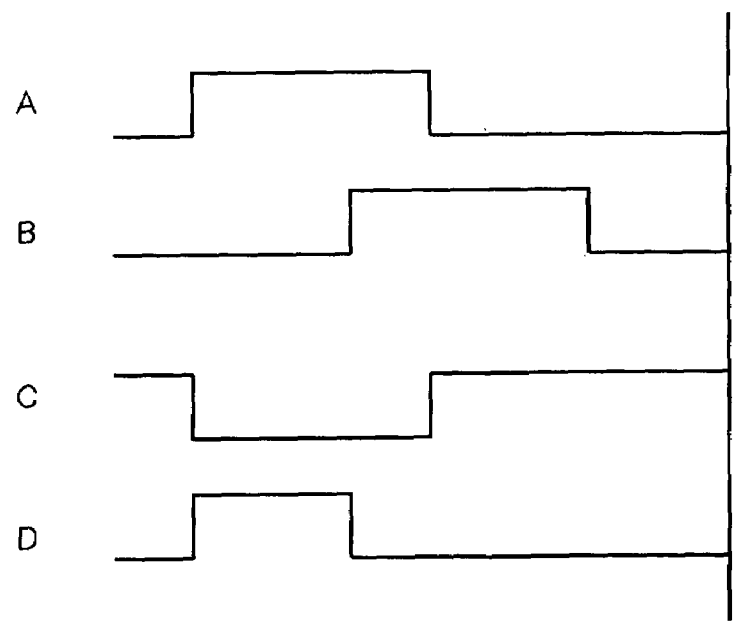
FIG. 4 is a timing-chart for describing a performance of the one-shot pulse generation circuit.

Here, a composition example and a performance of the one-shot pulse generation circuit 1 is described with employing FIG. 3 and FIG. 4.

As shown in FIG. 3, the one-shot pulse generation circuit 1 has four inverter circuits G11, G12, G13 and G14 connected in series with each other, an inverter circuit G15 provided in parallel with the inverter circuits G11 to G14, an OR circuit G16 receiving outputs of the inverter circuits G14 and G15, an inverter circuit G17 receiving an output of the OR circuit G16 and capacitors C11 and C12 provided between a connection point of the inverter circuits G11 and G12 and the ground potential GND and between a connection point of the inverter circuits G12 and G13 and the ground potential GND, respectively.

In FIG. 3, a signal input part of the inverter circuits G11 and G15 is illustrated as an A point, an output point of the inverter circuit G14 is illustrated as a B point, an output point of the inverter circuit G15 is illustrated as a C point and an output point of the inverter circuit G17 is illustrated as a D point, and signal states in the respective points are illustrated in FIG. 4.

Besides, a pulse signal in the A point illustrated in FIG. 4 corresponds to the control input signal S1 supplied to the one-shot pulse generation circuit 1.

A delay occurs on a pulse signal inputted to the inverter circuit G11 while going through the inverter circuits G12 and G13 by a presence of the capacitor C11, and the pulse signal becomes one delayed sharply in the B point, as shown in FIG. 4.

In the meantime, a pulse inputted in the inverter circuit G15 is outputted inverted in the C point, however, the delay does not occur. Accordingly, when signals in the B point and the C point are inputted to the OR circuit G16 and the output of the OR circuit G16 is inputted to the inverter circuit G17, an one-shot pulse having a pulse width corresponding to a signal delay width can be obtained in the D point.

In this manner, a pulse which is synchronous with the building-up of the inputted pulse signal and also can maintain the "H" state for a certain period set in an internal composition of the circuit can be obtained by inputting the pulse signal to the one-shot pulse generation circuit 1.

Here, the description of FIG. 2 returns again. The pulse signal S2 outputted by the one-shot pulse generation circuit is supplied to a NAND circuit G1 with the comparison result signal S4 outputted by the comparator 2, and an output of the NAND circuit G1 is supplied to a set input (S) of a RS flip-flop circuit 3 as a signal S5 via an inverter circuit G2.

Moreover, the control input signal S1 inverted via the inverter circuit G3 is supplied to a reset input (R) of the RS flip-flop circuit 3, and a Q output of the RS flip-flop circuit 3 is supplied to one input of the NOR circuit G4.

The control input signal S1 inverted via the inverter circuit G3 is supplied to the other input of the NOR circuit G4, and an output of the NOR circuit G4 is inverted via the inverter circuit G5 and is supplied the gate electrodes of the P channel MOS transistor 4 and the N channel MOS transistor 5. Besides, elements except for the gate driver GD constitute a short-circuit protection circuit SP in FIG. 2.

Figure 5:
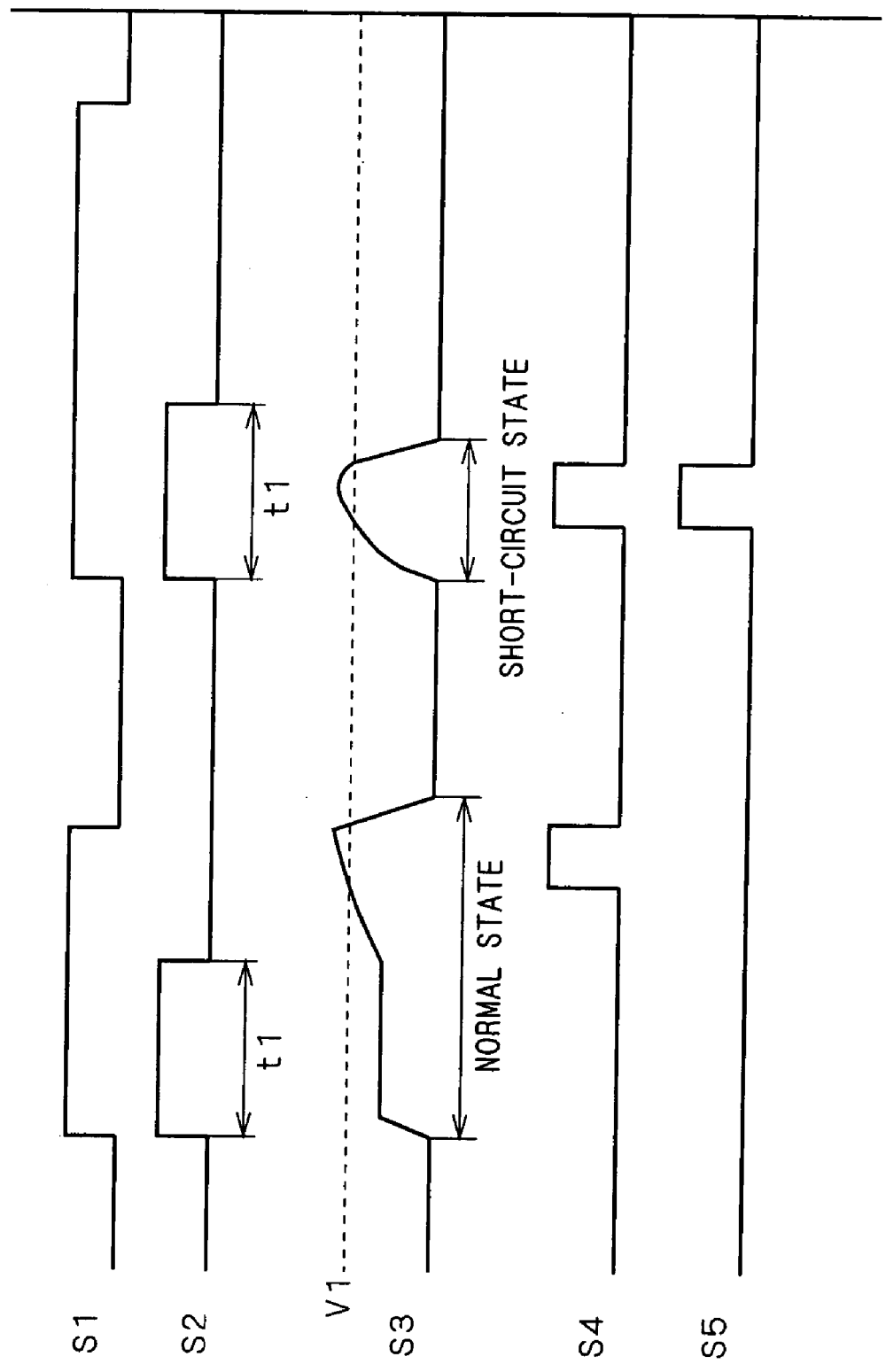
FIG. 5 is a timing-chart for describing a performance of the control device in the preferred embodiment 1 according to the present invention.

Next, a performance of the control device LIC is described with employing a timing chart illustrated in FIG. 5 in reference to FIG. 2.

The control input signal S1 supplied from the outside through the control signal input terminal $U_{IN}$ makes the transistor 12 be ON according to its rising and the transistor 12 maintains the ON state during a period when that control input signal S1 is in a high potential state.

Accordingly, as shown in FIG. 5, the control output signal S3 outputted from the gate driver GD rises according to the building up of the control input signal S1. Moreover, when a voltage of the control output signal S3 exceeds a threshold value of the transistor 12, the transistor 12 comes to be in ON state, and a collector-emitter voltage of the transistor 12 drops, thus a voltage of the control output signal S3 is clamped to a certain voltage for a determined period by a mirror effect, however, the voltage of the control output signal S3 rises to be a value almost equal to the drive voltage VCC of the gate driver GD after that. Moreover, it falls according to a trailing edge of the control input signal S1, and makes the transistor 12 be OFF.

In this manner, the transistor 12 which is the insulated gate type switching device such as the IGBT and so on has a characteristic that its control output signal S3 is clamped to a certain voltage for the determined period after its rising, in case that it normally operates.

Here, the control output signal S3 is supplied to the comparator 2, too, and compared with the reference voltage V1, and the comparator 2 makes the comparison result signal S4 which is the output of the comparator 2 be in a significant condition and a high potential "H" state in this case, when the voltage of the control output signal S3 exceeds the reference voltage V1. The state is maintained while the voltage of the control output signal S3 exceeds the reference voltage V1. Accordingly, in case that the transistor 12 illustrated in FIG. 2 is activated normally (in a normal state), the voltage of the control output signal S3 begins to increase after passing a clamp period, and when it exceeds the reference voltage V1, the comparator 2 outputs the comparison result signal S4. Moreover, the control output signal S3 begins to fall and when if falls below the reference voltage V1, the comparison result signal S4 falls, too.

In this manner, in case that the transistor 12 normally operates, the comparison result signal S4 outputted from the comparator 2 after the voltage of the control output signal S3 passes the clamp period comes to be in the significant condition. Besides, a value of the reference voltage V1 is set to be lower than the drive voltage VCC and higher than the clamp voltage. A value increasing approximately fifty percent of the clamp voltage is applied as an example.

Here, the one-shot pulse generation circuit 1 outputs the pulse signal S2 which comes to be in the significant condition according to the building up of the control input signal S1, and a period t1 in the significant condition, in the "H" state in this case, is set to be almost equal to a period when the control output signal S3 is clamped to a certain voltage. Accordingly, when the transistor 12 normally operates, the pulse signal S2 and the comparison result signal S4 outputted by the comparator 2 do not come to be in the significant condition synchronously, thus the signal S5 supplied to the setting input of the RS flip-flop circuit 3 maintains the low potential ("L") state, and the Q output of the RS flip-flop circuit 3 maintains the "L" state, too. Accordingly, the control output signal S3 is maintained, too, and the ON state in the transistor 12 is maintained.

By setting the period t1 in this manner, it is possible to prevent the transistor 12 from being forced to be turned OFF, even if the control output signal S3 exceeds the reference voltage V1 when the transistor 12 normally operates.

In the meantime, in case that the transistor 12 comes to be ON in a state that a short-circuit occurs between the source and the drain of the transistor 12, or, in case that the transistor 12 comes to be ON in a state that the transistor 11 connected in the totem pole like with the transistor 12 (FIG. 1) is ON (arm short-circuit), a clamp period of the voltage does not exist in the control output signal S3, and the voltage of the control output signal S3 rises rapidly to be almost equal to that of the drive voltage VCC. This state is illustrated in FIG. 5 as a waveform of the control output signal S3 in a short-circuit state.

As shown in FIG. 5, when the transistor 12 is short-circuited, the voltage of the control output signal S3 rises rapidly and exceeds the reference voltage V1 of the comparator 2, and the comparison result signal S4 outputted from the comparator 2 comes to be in the significant condition.

In this time, the pulse signal S2 is outputted from the one-shot pulse generation circuit 1 according to the rising of the control input signal S1, and the comparison result signal S4 also comes to be in the significant condition during the period when the pulse signal S2 is in the significant condition, thus a period when the pulse signal S2 and the comparison result signal S4 are in the significant condition synchronously exists, and the signal S5 supplied to the setting input of the RS flip-flop circuit 3 comes to be in the "H" state during that period. As a result, the Q output of the RS flip-flop circuit 3 changes to be in the "H" state, the P channel MOS transistor 4 of the gate driver GD comes to be in OFF state, the N channel MOS transistor 5 comes to be in ON state, the control output signal S3 comes to be in the "L" state and the transistor 12 is forced to be in OFF state. Besides, there is a case that the signal S5 is called as a stop signal, too, by reason that it stops a significant output of the control output signal S3 of the gate driver GD.

<A-3. Effect>

As described above, with regard to the control device LIC including the short-circuit protection function, the short-circuit state is detected by monitoring the control output signal S3 of the transistor 12 constituting the main circuit, and in case that the transistor 12 comes to be in the short-circuit state, the control output signal S3 is forced to stop, thus it is not necessary for the inverter module 100 to set the shunt resistor outside of the package PG (FIG. 1), differing from the conventional IPM. According to this, the current detecting terminal to measure the voltage of the shunt resistor is not necessary for the package PG and the control device LIC, and it is possible to make the module small, and moreover, the filter circuit to remove the noise entering the shunt resistor and the current detecting terminal is not necessary, too, thus it is possible to make the device small totally.

Moreover, the shunt resistor is not necessary, thus the length of the wiring from the ground main potential to the ground terminal of the switching device can be made to be short, and the voltage surge according to the switching of the switching device can be reduced.

<B. Preferred Embodiment 2>

<B-1. Composition of the Device>

Figure 6:
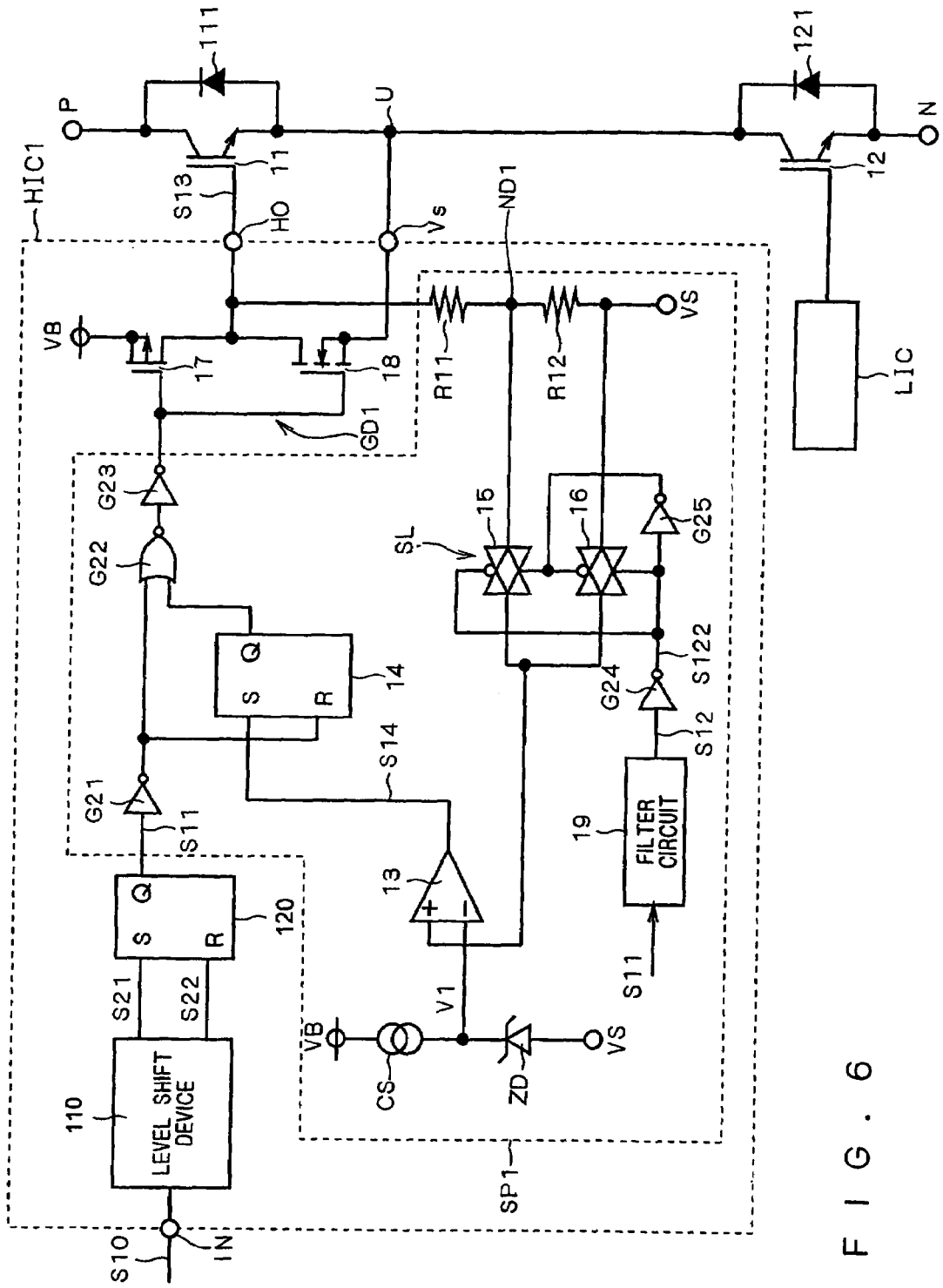
FIG. 6 is a drawing illustrating a composition of a control device in a preferred embodiment 2 according to the present invention.

A composition of the control device HIC1 including the short-circuit protection function is illustrated in FIG. 6 as the preferred embodiment 2 according to the present invention. Besides, the control device HIC1 illustrated in FIG. 6 is a circuit performing a switching control of the transistor 11, and the control devices HIC2 and HIC3 illustrated in FIG. 1 also have a similar function.

As shown in FIG. 6, an output signal of a gate driver GD1 composed of a P channel MOS transistor 17 and a N channel MOS transistor 18 connected in series between the drive voltage VB and the reference potential VS is supplied as a control output signal S13 to the gate electrode of the transistor 11 from the control signal output terminal HO, and moreover, the control output signal S13 is resistively divided between a resistance R11 and a resistance R12 and is inputted to a + (plus) side input terminal of a comparator 13 as a detecting voltage of the control output signal S13, too.

In a comparator 13, a comparison with the reference voltage V1 supplied to the − (minus) side input terminal is performed, and its comparison result is outputted as a comparison result signal S14. Besides, the composition illustrated in FIG. 2 can be applied as a composition to supply the reference voltage V1.

Here, the resistance R11 and the resistance R12 are set in series between the control signal output terminal HO and the reference potential VS to divide resistively the resistance of the control output signal S13, and a connection point ND1 of the resistance R11 and the resistance R12 is connected with an input terminal of a transmission gate 15. Moreover, a reference potential side end part of the resistance R12 is connected with an input terminal of a transmission gate 16, and an output terminal of the transmission gates 15 and 16 is connected with a + (plus) side input terminal of the comparator 13.

In this manner, the control output signal S13 of the transistor 11 which is a so-called device of high potential side can be detected by including the composition of dividing resistively the control output signal S13.

Besides, the transmission gates 15 and 16 output the voltage and the ground potential that the control output signal S13 is resistively divided on the basis of a pulse signal S12 outputted by a filter circuit 19 selectively, thus they are called as a signal selective part SL.

Moreover, a control signal S122 of the transmission gates 15 and 16 can be obtained by inverting the pulse signal S12 outputted by the filter circuit 19 in an inverter circuit G24, and the control device HIC1 has a composition that the control signal S122 is supplied to an inverted gate of the transmission gate 15 and a gate of the transmission gate 16 and the control signal S122 inverted furthermore in an inverter circuit G25 is supplied to a gate of the transmission gate 15 and an inverted gate of the transmission gate 16. A control input signal S10 supplied from outside through the control signal input terminal IN to control the transistor 11 is supplied to a level shift device 110 for a level shifting.

That is to say, the transistor 11 is the device of high potential, and its reference potential is supplied from a reference potential terminal Vs. Accordingly, it is necessary to level-shift the control input signal S10 generated on a basis of the ground potential to the high potential side through the level shift device 11.

The level shift device 11 generates an one-shot pulse signal indicating a timing of ON and OFF of the transistor 11 on a basis of the control input signal S10 supplied to it. Besides, that one-shot pulse signal is level-shifted to a signal based on the high potential through a high voltage transistor in the level shift device 11 and is outputted as one-shot pulse signals S21 and S22.

Moreover, the one-shot pulse signals S21 and S22 are supplied to a set input (S) and a reset input (R) of a RS flip-flop circuit 120, respectively, and they are outputted as a level-shifted signal S11 equal to the control input signal S10 from a Q output of the RS flip-flop circuit 120.

The level-shifted signal S11 is supplied to the gate driver GD1 via an inverter circuit G21, a NOR circuit G22 and an inverter circuit G23, and moreover, it is also supplied to a reset input of a RS flip-flop circuit 14.

In the meantime, the comparison result signal S14 is supplied to a set input of the RS flip-flop circuit 14, and a Q output of the RS flip-flop circuit 14 is supplied to one input of the NOR circuit G22.

The level-shifted signal S11 inverted via the inverter circuit G21 is supplied to the other input of the NOR circuit G22, and an output of the NOR circuit G22 is inverted via the inverter circuit G23 and is supplied to gate electrodes of a P channel MOS transistor 17 and a N channel MOS transistor 18.

Figure 7:
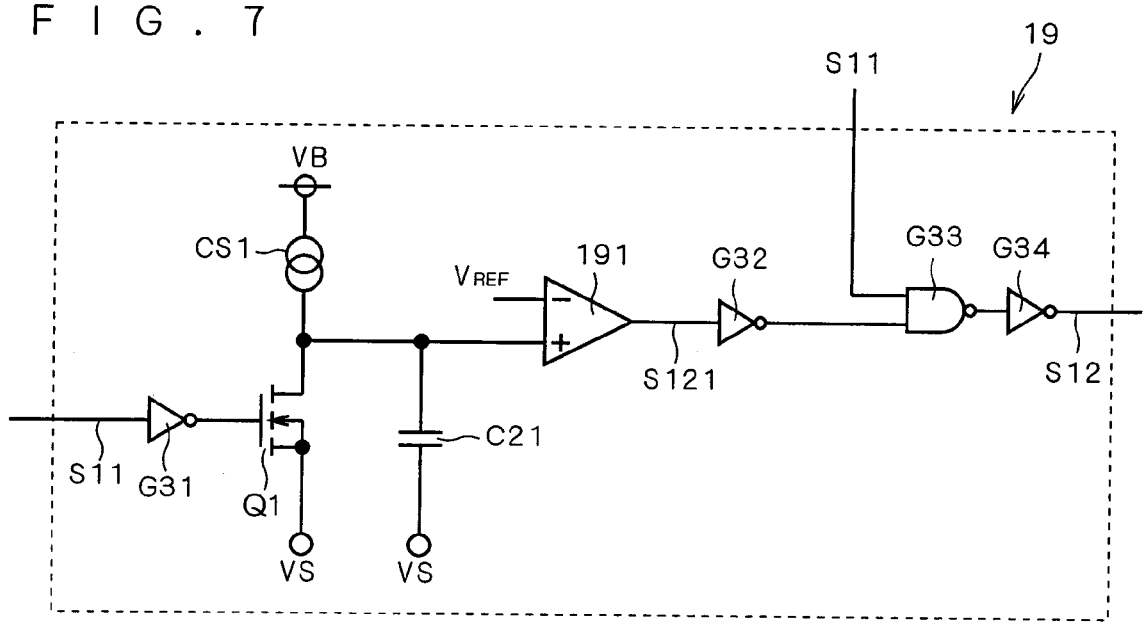
FIG. 7 is a drawing illustrating a composition of a filter circuit.
Figure 8:
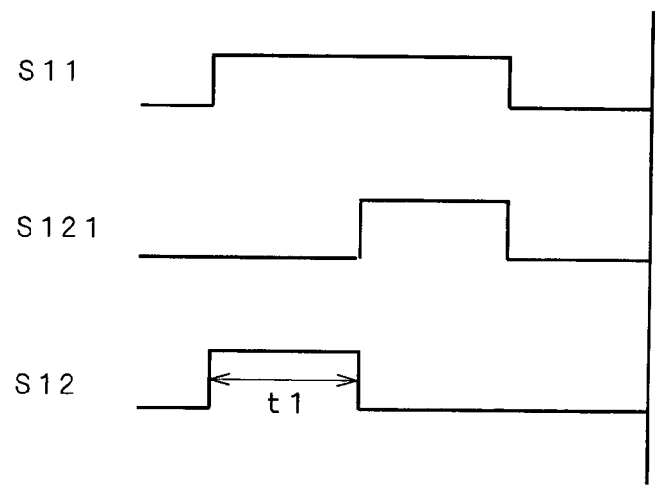
FIG. 8 is a timing-chart for describing a performance of the filter circuit.

Here, a composition example and a performance of the filter circuit performing as a pulse generation circuit is described with employing FIG. 7 and FIG. 8.

As shown in FIG. 7, the filter circuit 19 includes a constant current source CS1, a N channel MOS transistor Q1 whose drain is connected with the constant current source CS1 and source is connected with the reference potential VS, an inverter circuit G31 receiving the level-shifted signal S11 outputted from the RS flip-flop circuit 120 and inverting that level-shifted signal S11 and supplying it to the gate electrode of the transistor Q1, a comparator 191 whose + (plus) side input terminal is connected with a drain of the transistor Q1, a capacitor C21 inserted between the drain of the transistor Q1 and the reference potential VS, an inverter circuit G32 receiving an output signal S121 of the comparator 191, a NAND circuit G33 receiving an output of the inverter circuit G32 and the level-shifted signal S11 outputted by the RS flip-flop circuit 120 and an inverter circuit G34 inverting an output of the NAND circuit G33 and outputting it as the pulse signal S12.

Next, the performance is described. When the level-shifted signal S11 comes to be in the "H" state and the transistor Q1 comes to be OFF, a current flows from the constant current source CS to charge the capacitor C21. Moreover, when a voltage of the capacitor C21 exceeds a value of a reference voltage $V_{REF}$ supplied to the comparator 191, the output signal S121 of the comparator 191 comes to be in the "H" state. Besides, a time passed until a rising of the output signal S121 is set according to a capacitance of the capacitor C21 and a value of the reference voltage $V_{REF}$.

As shown in FIG. 8, the pulse signal S12 comes to be in the "H" state (significant condition) during a period when the level-shifted signal S11 is in the "H" state and the output signal S121 is in the "L" state, and this period t1 is a period when the short-circuit protection function is activated, and it is set to be almost equal to a period when the control output signal S13 is clamped to a constant voltage.

Moreover, in FIG. 6, elements except for the gate driver GD1, the level shift device 11 and the RS flip-flop circuit 120 constitute a short-circuit protection circuit SP1.

<B-2. Performance of the Device>

Figure 9:
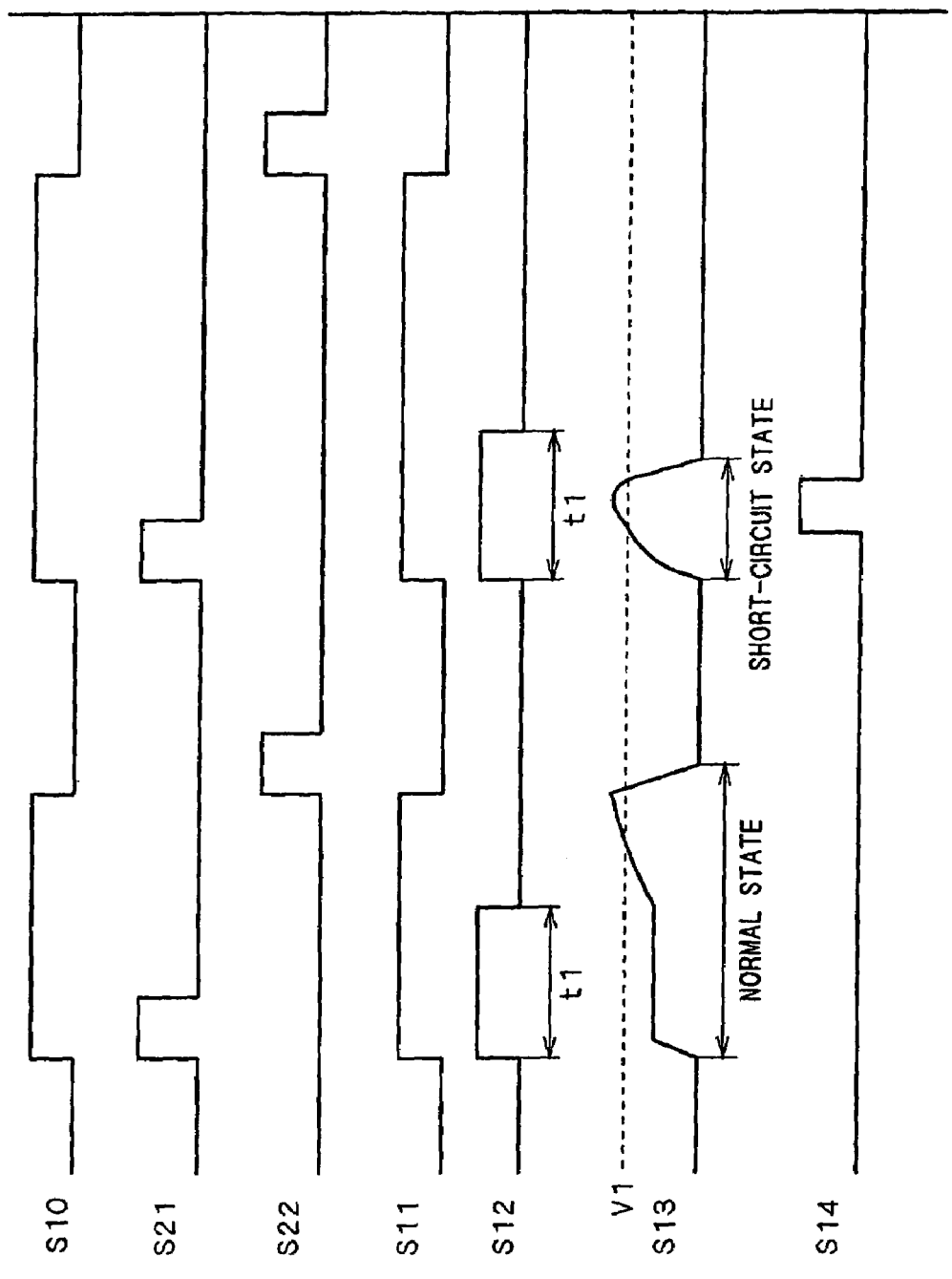
FIG. 9 is a timing-chart for describing a performance of the control device in the preferred embodiment 2 according to the present invention.

Next, a performance of the control device HIC1 is described with employing a timing chart illustrated in FIG. 9 in reference to FIG. 6.

A control input signal S10 supplied from the outside through a control signal input terminal IN is converted by the level shift device 11 into the one-shot pulse signal S21 rising according to a leading edge of the level shift device 11 and the one-shot pulse signal S22 rising according to a trailing edge of the level shift device 11.

Moreover, the one-shot pulse signals S21 and S22 are supplied to the RS flip-flop circuit 12 and become the level-shifted signal S11.

Moreover, the one-shot pulse signals S21 and S22 are supplied to the RS flip-flop circuit 120 and become the level-shifted signal S11.

As shown in FIG. 9, the control output signal S13 outputted from the gate driver GD1 rises according to the leading edge of the level-shifted signal S11, and the level-shifted signal S11 is substantially identical with the control input signal 10, thus there is also a case that the level-shifted signal S11 is called as a control input signal.

Besides, a waveform of the control output signal S13 when the transistor 11 normally operates and also when it is short-circuited is identical with that of the control output signal S3 described in the preferred embodiment 1, thus the description is omitted. Besides, in FIG. 9, the control output signal S13 and the reference voltage V1 are illustrated as to compare with each other, however, this is a description for convenience, and actually, a divided voltage of the control output signal S13 and the reference voltage V1 are compared with each other.

A voltage of the control output signal S13 is divided by the resistances R11 and R12, supplied to the comparator 13 and compared with the reference voltage V1, however, the transmission gate 16 is ON during the period when the pulse signal S12 outputted by the filter circuit 19 is in the "L" state, thus the reference potential VS is supplied to the comparator 13, and the comparison result signal S14 outputted by the comparator 13 is always in the "L" state.

In the meantime, the transmission gate 15 is ON during the period when the pulse signal S12 is in the "H" state, thus the divided voltage of the control output signal S13 is supplied to the comparator 13, and the comparison result signal S14 outputted by the comparator 13 comes to be in the "H" or the "L" state on a basis of a comparison result between that divided voltage and the reference voltage V1.

That is to say, when the divided voltage of the control output signal S13 exceeds the reference voltage V1, the comparator 13 makes the comparison result signal S14 which is the output of the comparator 13 be in the significant condition, the "H" state in this case.

When the transistor 11 is short-circuited, the voltage of the control output signal S13 rises rapidly and its divided voltage exceeds the reference voltage V1 of the comparator 13, however, the pulse signal S12 is in the "H" state at this time, thus the comparator 13 makes the comparison result signal S14 which is the output of the comparator 13 be in the "H" state (the significant condition). This state is maintained while the divided voltage of the control output signal S13 exceeds the reference voltage V1. As a result, the Q output of the RS flip-flop circuit 14 changes to be in the "H" state, the P channel MOS transistor 17 of the gate driver GD1 comes to be in OFF state, the N channel MOS transistor 18 comes to be in ON state, the control output signal S13 comes to be in the "L" state and the transistor 11 is forced to be in OFF state. Besides, there is a case that the signal S13 is called as a stop signal, too, by reason that it stops a significant output of the control output signal S13 of the gate driver GD1.

Besides, in case that the transistor 11 normally operates (in a normal state), the voltage begins to increase after passing the clamp period of the control output signal S13 and exceeds the reference voltage V1, and the pulse signal S12 is in the "L" state at this time, thus the comparison result signal S14 is in the "L" state. As a result, the Q output of the RS flip-flop circuit 14 maintains the "L" state, and the control output signal S13 maintains the "H" state, thus the transistor 11 maintains the ON state.

<B-3. Effect>

As described above, with regard to the control device HIC1 including the short-circuit protection function, the short-circuit state is detected by monitoring the control output signal S13 of the transistor 11 constituting the main circuit, and in case that the transistor 11 comes to be in the short-circuit state, the control output signal S13 is forced to stop, thus it is not necessary for the inverter module 100 to set the shunt resistor outside of the package PG (FIG. 1), differing from the conventional IPM. According to this, the current detecting terminal to measure the voltage of the shunt resistor is not necessary for the package PG, and it is possible to make the module small, and moreover, the filter circuit to remove the noise entering the shunt resistor and the current detecting terminal is not necessary, too, thus it is possible to make the device small totally.

Moreover, the shunt resistor is not necessary, thus the length of the wiring from the ground main potential to the ground terminal of the switching device can be made to short, and the voltage surge according to the switching of the switching device can be reduced.

Moreover, the period t1 when the short-circuit protection function is activated is set and the control output signal S13 is monitored only in that period t1 by the filter circuit 19, thus a strain on a motor system can be reduced.

<B-4. Modification Example>

The preferred embodiment 2 described above is premised on being applied to the HVIC, however, it can be applied to the LVIC, too.

In that case, the level shift device 11 and the RS flip-flop circuit 120 are not necessary, and the control input signal S1 is supplied to the inverter circuit G21 and the filter circuit 19 instead of the level-shifted signal S11. And the ground potential GND is used instead of the reference potential VS.

Moreover, each signal is described as one which does not have a delay as compared with the control input signal in the preferred embodiments 1 and 2 described above, however, there is also a case that, for example, the pulse signal S2 is delayed as compared with the control input signal S1 in some degree, however, a trouble does not occur to the performance of the present invention even in that case.

Moreover, the insulated gate transistors 11, 12, 21, 22, 31 and 32 are described as the N channel type transistors in the preferred embodiments 1 and 2 described above, however, the P channel type is also applicable to constitute them.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device controlling a drive of an insulated gate transistor by generating a control output signal on a basis of a control input signal, comprising:
    a driver outputting said control output signal and
    a short-circuit protection circuit detecting said control output signal and controlling and forcing said driver to stop said control output signal when a detecting voltage of said control output signal exceeds a predetermined reference voltage before a predetermined period passes after said control output signal indicates a conduction of said insulated gate transistor, wherein
    said short-circuit protection circuit includes:
    pulse generation circuit receiving said control input signal and outputting a first pulse signal being significant only in said predetermined period according to a timing when said control input signal indicates the conduction of said insulated gate transistor;
    a comparator receiving the detecting voltage of said control output signal, performing a comparison with said reference voltage and outputting a second pulse signal being significant during a period when the detecting voltage of said control output signal exceeds said reference voltage; and
    a logical circuit receiving said first and second pulse signals and outputting a stop signal forcing said driver to stop said control output signal when said second pulse signal becomes significant during a period when said first pulse signal is significant.

2. The semiconductor device according to claim 1, wherein said predetermined period when said first pulse signal is significant is set on a basis of a period when a voltage of said control output signal is clamped constantly when said insulated gate transistor normally operates.

3. A semiconductor device module, comprising:
    at least one set of first and second insulated gate transistors inserted in series between a high potential first main power terminal and a low potential second main power terminal and complementarily operating;
    a first control device controlling a drive of said first insulated gate transistor of a high potential side; and
    a second control device controlling a drive of said second insulated gate transistor of a low potential side, wherein
    said at least one set of first and second insulated gate transistors and said first and said second control devices are sealed with a resin in a package and
    said semiconductor device according to claim 1 is employed as said second control device and
    said second insulated gate transistor is controlled as said insulated gate transistor.

4. A semiconductor device controlling a drive of an insulated gate transistor by generating a control output signal on a basis of a control input signal, comprising:
    a driver outputting said control output signal and
    a short-circuit protection circuit detecting said control output signal and controlling and forcing said driver to stop said control output signal when a detecting voltage of said control output signal exceeds a predetermined reference voltage before a predetermined period passes after said control output signal indicates a conduction of said insulated gate transistor, wherein
    said short-circuit protection circuit includes:
    pulse generation circuit receiving said control input signal and outputting a first pulse signal being significant only in said predetermined period according to a timing when said control input signal indicates the conduction of said insulated gate transistor;
    a signal selective part receiving the detecting voltage of said control output signal and a predetermined voltage lower than said reference voltage and selectively outputting one of them on a basis of said first pulse signal; and
    a comparator receiving said output of said signal selective part, performing a comparison with said reference voltage and outputting a second pulse signal being significant during a period when said output of said signal selective part exceeds said reference voltage, wherein
    said signal selective part receives said first pulse signal, selects and outputs the detecting voltage of said control output signal during a period when said first pulse signal is significant and selects and outputs the predetermined voltage lower than said reference voltage during a period when said first pulse signal is not significant,
    said comparator receives the detecting voltage of said control output signal only in the period when said first pulse signal is significant and makes said second pulse signal significant in case that the detecting voltage of said control output signal exceeds said reference voltage and
    said second pulse signal functions as a stop signal forcing said driver to stop said control output signal when said second pulse signal is significant.

5. The semiconductor device according to claim 4, wherein the detecting voltage of said control output signal is detected by a divided resistance connected in series between an output terminal of said driver and a reference potential.

6. The semiconductor device according to claim 4, wherein
said predetermined period when said first pulse signal is significant is set on a basis of a period when a voltage of said control output signal is clamped constantly when said insulated gate transistor normally operates.

7. A semiconductor device module, comprising:
at least one set of first and second insulated gate transistors inserted in series between a high potential first main power terminal and a low potential second main power terminal and complementarily operating;
a first control device controlling a drive of said first insulated gate transistor of a high potential side; and
a second control device controlling a drive of said second insulated gate transistor of a low potential side, wherein
said at least one set of first and second insulated gate transistors and said first and said second control devices are sealed with a resin in a package and
said semiconductor device according to claim 4 is employed as said second control device and
said second insulated gate transistor is controlled as said insulated gate transistor.

8. A semiconductor device module, comprising:
at least one set of first and second insulated gate transistors inserted in series between a high potential first main power terminal and a low potential second main power terminal and complementarily operating;
a first control device controlling a drive of said first insulated gate transistor of a high potential side; and
a second control device controlling a drive of said second insulated gate transistor of a low potential side, wherein
said at least one set of first and second insulated gate transistors and said first and said second control devices are sealed with a resin in a package and
said semiconductor device according to claim 5 is employed as said first control device and
said first insulated gate transistor is controlled as said insulated gate transistor.

* * * * *